United States Patent
Salot et al.

(10) Patent No.: US 9,423,467 B2
(45) Date of Patent: Aug. 23, 2016

(54) METHOD OF PRODUCING A DEVICE HAVING BATTERIES WITH TESTING OF THE OPERATION OF THE BATTERIES BEFORE CONNECTING THEM ELECTRICALLY

(75) Inventors: Raphael Salot, Lans-en-Vercors (FR); Philipp Achatz, Grenoble (FR); Steve Martin, Saint-Sauveur (FR); Sami Oukassi, Saint-Egreve (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 227 days.

(21) Appl. No.: 14/128,285

(22) PCT Filed: Jun. 28, 2012

(86) PCT No.: PCT/FR2012/000260
§ 371 (c)(1),
(2), (4) Date: Dec. 20, 2013

(87) PCT Pub. No.: WO2013/004922
PCT Pub. Date: Jan. 10, 2013

(65) Prior Publication Data
US 2014/0154401 A1 Jun. 5, 2014

(30) Foreign Application Priority Data
Jul. 1, 2011 (FR) ...................................... 11 02080

(51) Int. Cl.
*G01R 31/36* (2006.01)
*H01M 10/04* (2006.01)
(Continued)

(52) U.S. Cl.
CPC .......... *G01R 31/3658* (2013.01); *H01M 2/266* (2013.01); *H01M 6/40* (2013.01);
(Continued)

(58) Field of Classification Search
CPC combination set(s) only.
See application file for complete search history.

(56) References Cited

U.S. PATENT DOCUMENTS

2004/0185334 A1* 9/2004 Iwamoto ............... H01M 4/131
429/127
2005/0233210 A1 10/2005 Horie et al.
(Continued)

FOREIGN PATENT DOCUMENTS

WO WO 2008/004161 A2 1/2008
WO WO 2011107675 A1 * 9/2011 ............ H01M 2/204

OTHER PUBLICATIONS

Alahmad et al., "Battery switch array system with application for JPL's rechargeable micro-scale batteries," *Journal of Power Sources*, vol. 177, No. 2, pp. 566-578, Nov. 23, 2007.
(Continued)

*Primary Examiner* — Ula C Ruddock
*Assistant Examiner* — Matthew Van Oudenaren
(74) *Attorney, Agent, or Firm* — Oliff PLC

(57) ABSTRACT

The method of producing a device having batteries includes the following successive steps performed on a support substrate:
providing a support substrate including a first electrically conducting layer forming a main surface,
simultaneously forming a plurality of batteries on the first electrically conducting layer,
testing operation of the plurality of batteries to discriminate between a first group of functional batteries and a second group of defective batteries,
forming a second electrically conducting layer electrically insulated from the first electrically conducting layer, the second electrically conducting layer and the first electrically conducting layer being configured to connect only the functional batteries in parallel.

19 Claims, 4 Drawing Sheets

(51) Int. Cl.
*H01M 2/26* (2006.01)
*H01M 6/40* (2006.01)
*H01M 10/0525* (2010.01)
*H01M 10/0565* (2010.01)
*H01M 10/0585* (2010.01)
*H01M 10/48* (2006.01)
*H01M 10/42* (2006.01)

(52) U.S. Cl.
CPC ....... *H01M 10/04* (2013.01); *H01M 10/0436* (2013.01); *H01M 10/0525* (2013.01); *H01M 10/0565* (2013.01); *H01M 10/0585* (2013.01); *H01M 10/4207* (2013.01); *H01M 10/4285* (2013.01); *H01M 10/48* (2013.01); *H01M 10/482* (2013.01); *Y02E 60/122* (2013.01); *Y02P 70/54* (2015.11)

(56) References Cited

U.S. PATENT DOCUMENTS

| | | | |
|---|---|---|---|
| 2008/0003493 | A1 | 1/2008 | Bates |
| 2009/0193649 | A1* | 8/2009 | Niessen ............... H01M 4/0407 29/623.5 |
| 2012/0321938 | A1* | 12/2012 | Oukassi ................ H01M 2/204 429/162 |
| 2013/0260183 | A1* | 10/2013 | Ellis-Monaghan ..... H01M 2/22 429/7 |

OTHER PUBLICATIONS

International Search Report issued in Application No. PCT/FR2012/000260; Dated Sep. 11, 2012 (With Translation).

* cited by examiner

METHOD OF PRODUCING A DEVICE HAVING BATTERIES WITH TESTING OF THE OPERATION OF THE BATTERIES BEFORE CONNECTING THEM ELECTRICALLY

BACKGROUND OF THE INVENTION

The invention relates to a method for producing a battery device.

STATE OF THE ART

Battery devices as a general rule comprise batteries arranged in the form of matrices on a support substrate. All the batteries are electrically connected in parallel to form a circuit optimizing the energy storage capacity of the device while at the same time keeping the same voltage. When the batteries are connected in parallel, it suffices for one of the batteries to be defective for the whole of the matrix to undergo a drastic loss of efficiency, or to even become defective itself.

Thus, when a battery matrix is fabricated, the different batteries are formed on a substrate and are then tested individually. The functional batteries are then removed from the substrate and are then stuck onto a new substrate where they will be electrically connected in parallel.

This method is costly to implement as it requires a large number of steps. In addition, it suffices for one of the batteries to be damaged during the separation operations consecutive to testing to make the battery device non-operational, thereby resulting in relatively low manufacturing yields.

OBJECT OF THE INVENTION

The object of the invention consists in producing a battery device that is easy to implement to reduce manufacturing costs and increase the yields of such a device, in particular on large surfaces.

This object tends to be achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The method, and its variants, illustrates production of a device having batteries the steps of which enable an optimal efficiency to be obtained while at the same time guaranteeing ease of implementation.

Figure 1:
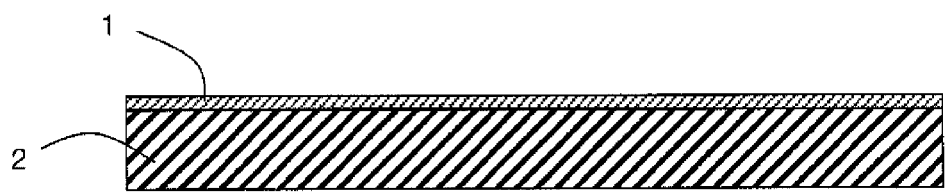
FIG. 1 illustrates a cross-sectional view of execution of a step of the method consisting in depositing an electrically conducting layer on a substrate.

In FIG. 1, the method comprises a first step in which a first electrically conducting layer 1 is deposited on a support substrate 2 so as to obtain a support substrate 2 comprising a first electrically conducting layer 1 forming a main surface.

First electrically conducting layer 1 is designed to subsequently at least partially form a first current collector of the battery device.

Figure 2:
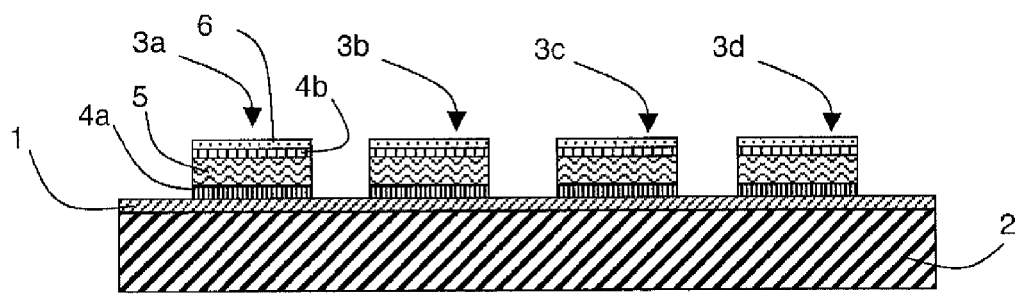
FIG. 2 illustrates a cross-sectional view of a formation step of a plurality of batteries.

In FIG. 2, following the step of deposition of first electrically conducting layer 1 on support substrate 2, a plurality of batteries 3a, 3b, 3c, 3d are formed on first electrically conducting layer 1. Electrically conducting layer 1 preferably electrically connects the plurality of batteries 3a, 3b, 3c, 3d. Batteries 3a, 3b, 3c, 3d are situated in the same plane parallel to support substrate 2.

Each battery 3a, 3b, 3c, 3d can comprise a stack made on first electrically conducting layer 1. A stack can comprise a first electrode 4a, an electrolytic membrane 5, and a second electrode 4b, first electrode 4a being in electric contact with first electrically conducting layer 1. In other words, membrane 5 and second electrode 4b are arranged successively above first electrode 4a in an opposite direction to support substrate 2.

Advantageously, the formation step of batteries 3a, 3b, 3c, 3d is performed in simultaneous manner on said support substrate 2. In other words, all the batteries 3a, 3b, 3c, 3d are obtained after deposition and patterning, or selective deposition with use of suitable masks, of layers designed to form the stacks. This can be achieved by using monolithic technologies. The particular advantage of such a production method is to ensure that the batteries are identical. Indeed, another problem related to parallel connection of batteries is that the latter are preferably identical and originate from the same fabrication batches to ensure optimal operation of the final device. In the present case, as the batteries originate from deposition of the same layers, it is ensured that identical batteries are obtained, which has the consequence of increasing the yields and the quality of the manufactured battery devices.

Figure 3:
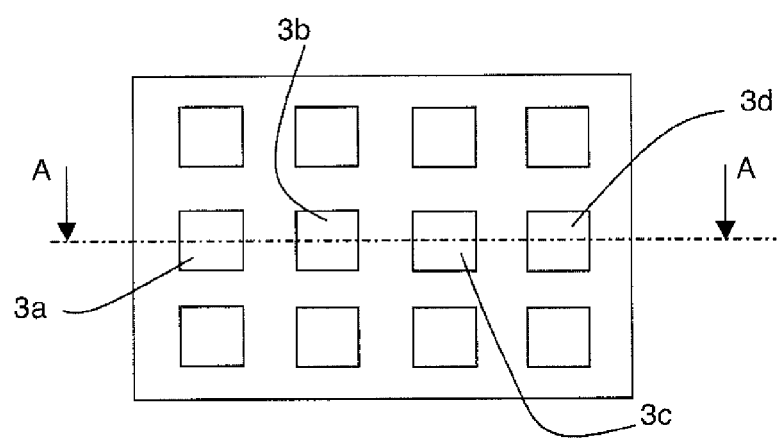
FIG. 3 illustrates a top view of FIG. 2.

FIG. 3 illustrates a top view of the device having batteries after formation of the stacks. Batteries 3a, 3b, 3c, 3d of FIG. 2, which is a cross-sectional view along the line A-A of FIG. 3, can be seen in this figure. Advantageously, in order to optimize the number of batteries on one and the same support, the latter are formed in the form of a matrix so as to be aligned in lines and columns.

Figure 4:
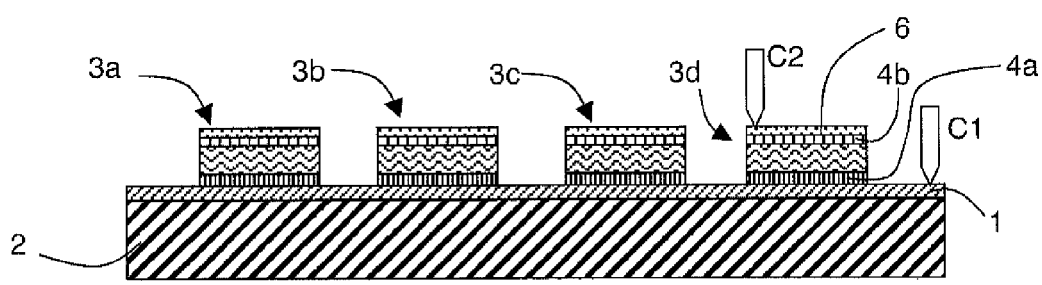
FIG. 4 illustrates a cross-sectional view of the electric testing step of the batteries to differentiate the functional batteries from the defective batteries.

As illustrated in FIG. 4, after the plurality of batteries 3a, 3b, 3c, 3d have been formed, the method comprises a step in which operation of the batteries is tested. The object of these tests is to determine which batteries are functional and the battery or batteries which are possibly defective, in other words the object of this test is to discriminate between a first group of functional batteries 3a, 3b, 3d and a second group of defective batteries 3c. This testing step is preferably performed by taking, for each battery 3a, 3b, 3c, 3d, a first electric contact C1 on first electrically conducting layer 1 and a second electric contact C2 associated with second electrode 4b of battery 3d concerned to perform electric testing of said battery 3d. As in FIG. 4, contacts C1 and C2 can be in the form of tips commonly used in microelectronics for testing circuits. The electric testing can be performed by measuring the internal resistance of battery 3*d*, by measuring the current flowing through battery 3*d* in open circuit (OCV for Open Circuit Voltage), or by the Electrochemical Impedance Spectroscopy (EIS) method. Such testing enables fast and non-destructive measurements to be made for the stack. In addition to electric testing, it is also possible to check the batteries by optic infrared thermography, AFM (Atomic Force Microscopy), FTIR (Fourier Transform Infrared Spectroscopy), XPS (X-ray Photoelectron Spectroscopy), depending on the results of these tests, if a battery does not have sufficient quality characteristics, it will be rejected and considered as being defective.

A battery can be considered as being defective when it no longer complies with requirement specifications, for example a voltage threshold, a current threshold, a recharging time, etc.

When testing is performed, first contact C1 can be a permanent contact, i.e. this contact C1 will be used to test all the batteries without moving said first contact C1 between two tests of different batteries. This is made possible by the fact that, at the time testing is performed, first electrically conducting layer 1 is preferably in electric contact with first electrodes 4*a* of all the batteries 3*a*, 3*b*, 3*c*, 3*d*. Second contact C2 will for its part be able to be moved from battery to battery to be associated with the corresponding second electrode 4*b*.

What is meant by "associated with second electrode 4*b*" is that when testing is performed, it is possible to place second contact C2 in direct contact with second electrode 4*b*, or with an electrically conducting intermediate layer 6 of the battery arranged at the apex of the stack opposite support substrate 2 (FIGS. 2 and 4). This intermediate layer 6 can be in direct contact with second electrode 4*b*. Intermediate layer 6 enables two functions to be performed, protection of the stack and improvement of the electric contacts to facilitate electric testing, this layer 6 preferably being made from titanium, nickel, platinum, or other suitable materials. In fact to perform testing, it suffices to have an electric continuity between first contact C1 and first electrode 4*a* and between second contact C2 and second electrode 4*b*.

After all the batteries have been tested, it is easy to draw up a mapping of the defective and/or functional batteries which will be able to be used to establish a future circuit of the battery device.

Figure 5:
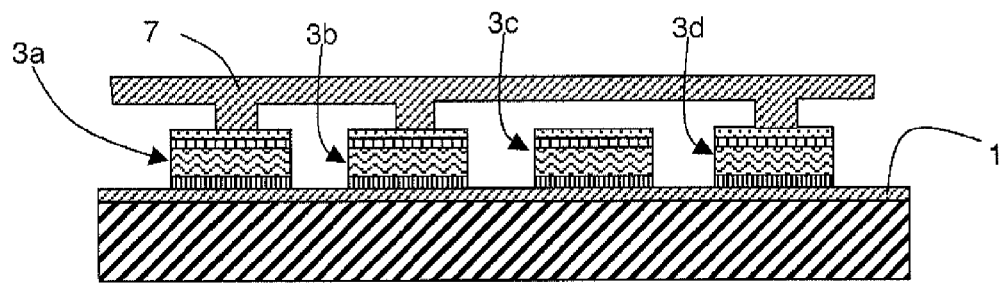
FIG. 5 illustrates a cross-sectional view obtained after the step in which the functional batteries are connected in parallel.

As illustrated in FIG. 5, a second electrically conducting layer 7, electrically insulated from first electrically conducting layer 1, is deposited, after testing of the batteries, in order to form a circuit in which only the functional batteries are connected in parallel, any defective battery or batteries then being disconnected from the circuit. First electrically conducting layer 1 and second electrically conducting layer 7 are configured to connect only functional batteries 3*a*, 3*b* and 3*c* in parallel. Second electrically conducting layer 7 then at least partly forms a second current collector of the device having batteries, parallel connection then being made between the first and second current collectors.

The capacity, and also the maximum power of the obtained device having batteries, will be a function of the filling ratio of the available surface of the support substrate and of the number of defective batteries.

In the particular example of FIG. 5, batteries 3*a*, 3*b* and 3*d* are functional and battery 3*c* is defective. First and second electrically conducting layers 1, 7 form current collectors connecting the functional batteries in parallel. Defective battery 3*c* is electrically connected to one of the current collectors only (layer 7), and it is therefore not included in the parallel circuit of the functional batteries.

Formation of the parallel-connected circuit of functional batteries can be implemented according to different embodiments.

Figure 6:
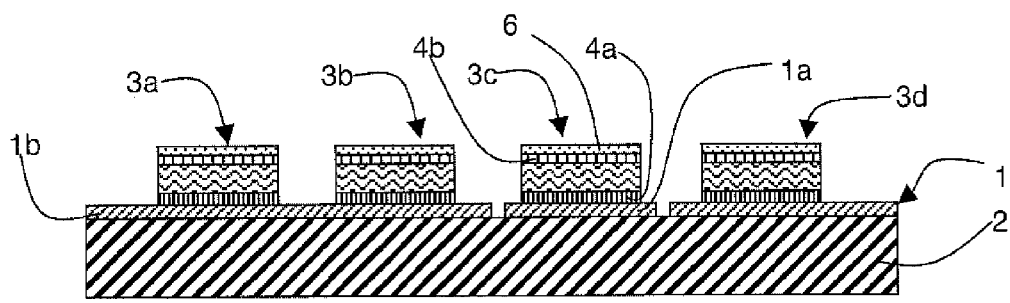
FIGS. 6 to 9 illustrate a first embodiment enabling the functional batteries to be electrically connected in parallel.
Figure 7:
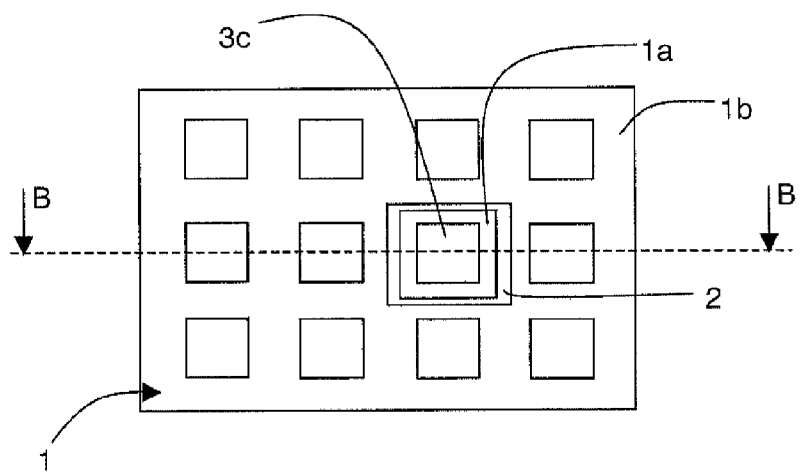

In a first embodiment illustrated in FIGS. 6 to 9, a portion 1*a* of first electrically conducting layer 1 supporting a defective battery 3*c* is electrically insulated from another portion 1*b* of first electrically conducting layer 1, common to functional batteries 3*a*, 3*b*, 3*d* as illustrated in FIGS. 6 and 7, FIG. 7 being a top view of FIG. 6 associated with cross-section B-B. In fact, portion 1*a* at least preferably corresponds to a portion of the first electrically conducting layer in electric contact with first electrode 4*a* of the defective battery. The dimensions of this portion 1*a* are at least equal to the dimensions of the supported defective battery so as to electrically insulate the defective battery from portion 1*b* common to the functional batteries. This step of insulation of a defective battery can be performed before the deposition step of second electrically conducting layer 7, first layer 1 then still being accessible between two adjacent batteries. Preferably, all the defective batteries are insulated in this manner before deposition of second electrically conducting layer 7. For example, insulation of a defective battery 3*c* is performed by etching of first electrically conducting layer 1 up to support substrate 2 (FIGS. 6 and 7). Etching can be performed by any suitable method known to the person skilled in the art. A laser etching technique, which is a method that is flexible and configurable to suit requirements, will preferably be used. According to the mapping of the functional and/or defective batteries, laser etching will be reiterated on each defective battery. After insulation of the defective batteries, second electrically conducting layer 7 can then be deposited so as to electrically connect all the batteries at the level of the second electrodes 4*b*. What is meant by "at the level of the second electrodes" is that electric continuity is established between second electrodes 4*b* and second electrically conducting layer 7, either by direct contact or with interposition of an electrically conducting layer such as intermediate layer 6 referred to in the foregoing. In other words, disconnecting a defective battery 3*c* from the circuit is performed by insulation of portion 1*a* of the first electrically conducting layer supporting said defective battery of portion 1*b* of the first electrically conducting layer associated with the functional batteries. In fact in FIG. 9, second electrically conducting layer 7 is in electric continuity with all the second electrodes 4*b* of the batteries, only portion 1*b* common to all the functional batteries enables all the functional batteries to be electrically connected in parallel.

Figure 8:
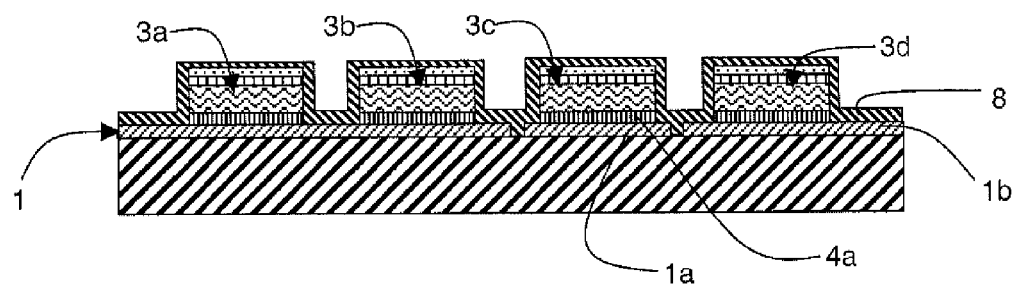
Figure 9:
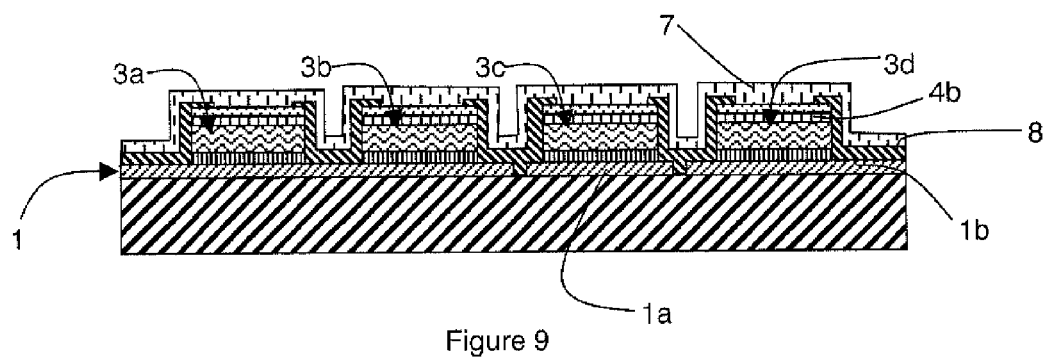

In this first embodiment, electric insulation between first electrically conducting layer 1 and second electrically conducting layer 7 can be achieved by interposition of an electrically insulating layer 8. Thus, as illustrated in FIG. 8, after all the defective batteries 3*c* have been insulated, an electrically insulating layer 8 is deposited (FIG. 8) on the batteries and between the batteries, preferably by conformal deposition. This electrically insulating layer 8 is then patterned so as to leave all the batteries 3*a*, 3*b*, 3*c*, 3*d* accessible at the level of second electrodes 4*b* (FIG. 9). The openings generated by patterning enable second electrically conducting layer 7 to be deposited (FIG. 9) by placing said second electrically conducting layer 7 in electric continuity with all the second electrodes (direct contact or with interposition of intermediate layer 6). Electrically insulating layer 8 can be of dielectric type.

In the first embodiment, the first current collector is formed by portion 1*b* of the first electrically conducting layer common to the functional batteries and the second current collector is formed by second electrically conducting layer 7.

Figure 10:
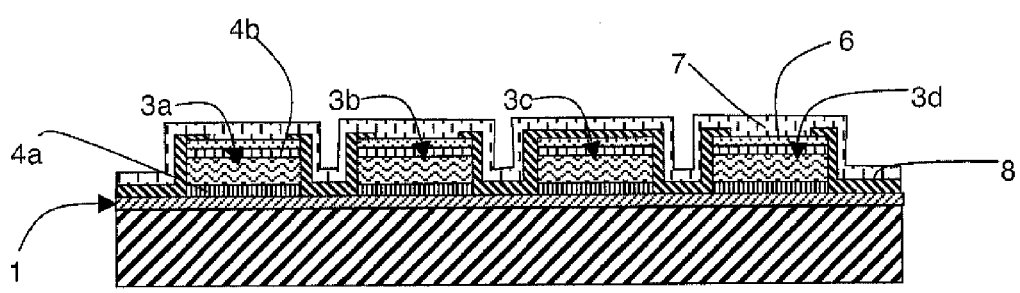
FIG. 10 illustrates a second embodiment enabling the functional batteries to be electrically connected in parallel.

According to a second embodiment illustrated in FIG. 10, second electrically conducting layer 7 is deposited after an electrically insulating layer 8, said electrically insulating layer 8 covering said batteries. Before deposition of second electrically conducting layer 7, electrically insulating layer 8 is opened locally in several places to leave only functional batteries 3a, 3b, 3d accessible so that, after it has been deposited, said second electrically conducting layer 7 electrically connects only the functional batteries at the level of the localized openings of electrically insulating layer 8. Functional batteries 3a, 3b, 3d are connected through electrically insulating layer 8. An opening can be made by local ablation of electrically insulating layer 8 by laser. This embodiment is preferred to the first embodiment as the areas of material to be removed are of smaller surfaces. This therefore enables the fabrication rate to be increased, a single opening being sufficient whereas in the first embodiment first electrically conducting layer 1 has to be ablated all around the defective battery.

In this second embodiment, first electrically conducting layer 1 is preferably in electric contact with all the first electrodes 4a of the batteries, and second electrically conducting layer 7 is in electric contact only with second electrodes 4b of functional batteries 3a, 3b, 3d, battery 3c then being disconnected from the circuit. The electric contact between second electrically conducting layer 7 and an electrode 4b can be direct or by interposition of an intermediate layer 6 as stipulated in the foregoing.

In the second embodiment, the first current collector is formed by first electrically conducting layer 1 and the second current collector is formed by second electrically conducting layer 7.

Figure 11:
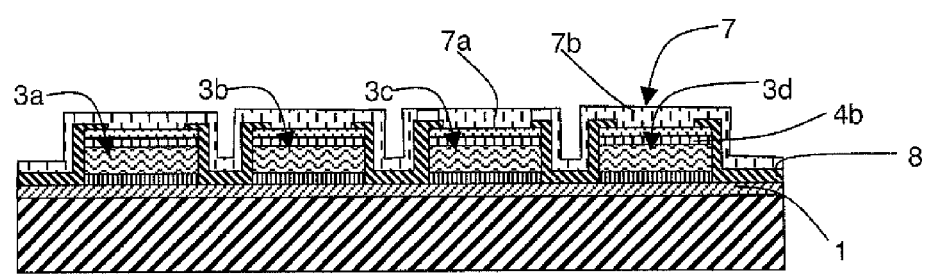
FIG. 11 illustrates a third embodiment.

According to a third embodiment illustrated in FIG. 11, second electrically conducting layer 7 is deposited so as to be electrically connected with all the batteries 3a, 3b, 3c, 3d. Second electrically conducting layer 7 is then patterned to electrically insulate a portion 7a of the second electrically conducting layer associated with a defective battery of another portion 7b of the second electrically conducting layer common to the functional batteries (the functional batteries then have their second electrodes 4b electrically connected to common portion 7b). This patterning can be performed for all the defective batteries, for example in the same way as described above for the embodiment where the first electrically conducting layer is patterned in portions. Portion 7a associated with a defective battery preferably corresponds to a portion of second electrically conducting layer 7 which is in electric continuity with the second electrode of the defective battery, the dimensions of said portion 7a being at least defined by the surface of second electrically conducting layer 7 at the interface with the defective battery so as to prevent electric contact between defective battery 3c and portion 7b common to the functional batteries.

In a manner that is applicable to the first and third embodiments, when adjacent batteries are defective, ablation of the associated electrically conducting layer enabling insulation of the latter can be performed so that a single portion, distinct from the portion common to the functional batteries, is associated with several defective batteries, this enabling removal of material at the level of the electrically conducting layer concerned to be limited, thereby increasing the fabrication rate of the devices.

In the third embodiment, the first current collector is formed by portion 7b of second electrically conducting layer 7 common to the functional batteries and the second current collector is formed by first electrically conducting layer 1.

Figure 12:
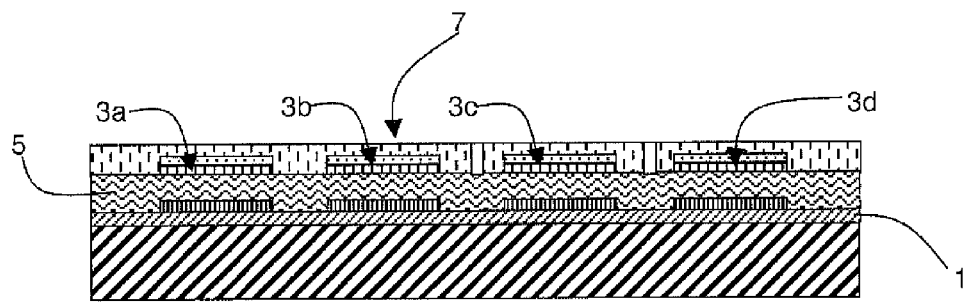
FIG. 12 illustrates a variant of execution of the third embodiment.

In a variant of the third embodiment illustrated in FIG. 12, the step of formation of the plurality of batteries 3a, 3b, 3c, 3d preferably comprises deposition of an electrolytic membrane 5 common to all the batteries, said electrolytic membrane 5 electrically insulating first and second electrically conducting layers 1, 7 between the batteries. In other words, in the plurality of batteries, each battery comprises two electrodes that are exclusively associated with the latter, and electrolytic membrane 5 forms a single non-patterned layer common to all the batteries. The advantage of this common membrane 5 is to be able to dispense with deposition of an additional insulating layer acting as electric insulator between first and second electrically conducting layers 1, 7. Indeed, in the latter case, the role of electric insulation between first and second electrically conducting layers 1, 7 is performed by membrane 5 itself which, as illustrated in FIG. 11, covers the batteries and the spaces between two adjacent batteries.

According to another embodiment, second electrically conducting layer 7 is deposited only on functional batteries 3a, 3b, 3d in order to form a battery device comprising functional batteries 3a, 3b, 3d electrically connected in parallel and defective batteries 3c electrically insulated from functional batteries 3a, 3b, 3d.

Finally, although this is not represented in the figures, the battery device can be encapsulated to protect said device against the outside atmosphere. Such a protection can be formed by a stack of thin layers, by a lamination, by addition of a cover, etc.

In the different examples and embodiments, the device can be fabricated from a base formed by thin layers. The first electrically conducting layer can be made from Al, Pt, Au, Ti, W, or Mo. One of the electrodes called positive electrode is made from LiTiOS, $LiCoO_2$, $LiNiO_2$, $LiMn_2O_4$, CuS, $CuS_2$, $WO_yS_z$, $TiO_yS_z$, $V_2O_5$. Depending on the materials chosen for the positive electrode, thermal annealing may be necessary to increase the crystallization of the associated layer and enhance its ion insertion property, in particular for lithiated oxides, certain amorphous materials, such as titanium oxysulfides, on the other hand don't require such a treatment to enable a high lithium ion insertion. The electrolytic membrane is preferably a good ionic conductor and an electric insulator, and is generally formed from a vitreous material having a base formed by boron oxide, lithium oxides or lithium salts. Membranes having a LiPON, LiSiPON or LiPONB base will be preferred for their performances. The negative electrode can be Si, metallic lithium deposited by thermal evaporation, a metallic lithium alloy or an insertion compound (SiTON, SnNx, InNx, SnO2, etc.), the negative electrode may also not be present, in which case a metal layer blocking the lithium is deposited and the lithium is then electrodeposited on this layer. Generally, these layers are patterned to delineate the stacks (with the possible exception of the layer designed to form the membrane), by means for example of mechanical masking, photolithography, laser etching techniques. Methods such as photolithography will be preferred as they enable great precision to be achieved with small etching marks to maximize the active surface of the batteries and therefore the maximum capacity of the battery device.

According to a particular exemplary embodiment, the first electrically conducting layer is made from aluminium, the first electrodes are made from LiTiOS, membranes 5 are made from LiPONB, the second electrodes are made from Si, intermediate layer 6 is made from titanium, and the second electrically conducting layer is made from aluminium, titanium, nickel or other suitable materials.

According to a variant that is not represented, when a defective battery is detected, a localized etching step is subsequently performed to remove the defective whole stack down to the first electrically conducting layer.

In the different embodiments described in the foregoing, functional batteries 3a, 3b, 3d are electrically connected to first electrically conducting layer 1 and to second electrically conducting layer 7, and defective battery 3c is connected to the plus of one of electrically conducting layers 1,7. For example, the defective battery is either electrically connected to one of electrically conducting layers 1,7 only or electrically insulated from first electrically conducting layer 1 and from second electrically conducting layer 7.

The batteries form opaque active areas by construction. Outside these active areas, the device having batteries will preferably be transparent. For this, first and second electrically conducting layers 1 and 7 will preferably be made from TCO (transparent conducting oxides). Between adjacent batteries, first and second electrically conducting layers 1 and 7 may if required be separated by a single electrically insulating layer 8 that is also transparent. In the third embodiment where first and second electrically conducting layers 1 and 7 are separated by a portion of electrolytic membrane 5 between two adjacent batteries, electrolytic membrane 5 will preferably be made from lithiated glass to give it transparency properties. The use of this type of material enables the final device to be provided with transparency properties. For example, a filling ratio of 10% of the surface of the support substrate leads to a transmittance factor of about 70%. A filling ratio of up to 40% can be achieved. A trade-off between capacity and transmittance can consequently be found. The lateral dimensions of the stacks will furthermore preferably be smaller than 100 µm so as not to be visible to the naked eye. Advantageously, the batteries are arranged so as to obtain a filling ratio of support substrate 2 that is less than or equal to 40% and the surface of each battery is smaller than or equal to $10^4$ µm$^2$. What is meant by surface of a battery is the surface occupied by the battery at the level of support substrate 2. The batteries are preferably arranged in homogenous manner at the surface of the substrate, for example in the form of a matrix as indicated previously.

The advantage of transparency can be used to provide for example an active window with electrochrome which requires energy to change colour, or for encapsulation of a photovoltaic cell.

When at least one battery is detected as being defective, the battery device obtained comprises a plurality of batteries a first set of which comprises functional batteries electrically connected in parallel, and a second set of which comprises at least one defective battery connected to only one of the current collectors formed by one of the electrically conducting layers.

The targeted applications include autonomous sensors, smart cards, smart labels, and the whole range of flexible electronics on large surfaces.

The invention claimed is:

1. A method for producing a device having batteries, said method comprising the following successive steps:
providing a support substrate comprising a first electrically conducting layer forming a main surface;
simultaneously forming a plurality of batteries on the first electrically conducting layer, each battery of the plurality of batteries being formed in contact with the first electrically conducting layer;
performing a testing operation of the plurality of batteries to discriminate between a first group of functional batteries and a second group of defective batteries; and
forming a second electrically conducting layer electrically insulated from the first electrically conducting layer, the second electrically conducting layer and the first electrically conducting layer being configured to connect only the functional batteries in parallel.

2. The method according to claim 1, wherein the plurality of batteries is formed on the first electrically conducting layer, the first electrically conducting layer electrically connecting the plurality of batteries.

3. The method according to claim 1, wherein the plurality of batteries are situated in one and a same plane parallel to the support substrate.

4. The method according to claim 1, wherein the plurality of batteries are arranged so as to obtain a filling ratio of the support substrate less than or equal to 40%, a surface of each battery being smaller than or equal to $10^4$ µm$^2$.

5. The method according to claim 1, wherein each battery of the plurality of batteries comprises a stack comprising a first electrode, an electrolytic membrane, and a second electrode, the first electrode being in electric contact with the first electrically conducting layer.

6. The method according to claim 5, wherein the testing step is performed by taking, for each battery of the plurality of batteries, a first electric contact on the first electrically conducting layer, and a second electric contact associated with the second electrode of the battery concerned so as to perform electric testing of each battery.

7. The method according to claim 1, wherein the functional batteries are connected to the first electrically conducting layer and to the second electrically conducting layer, the defective batteries being electrically connected to one of the first electrically conducting layer and the second electrically conducting layer only or electrically insulated from the first electrically conducting layer and from the second electrically conducting layer.

8. The method according to claim 1, wherein a portion of the first electrically conducting layer covered by the defective batteries is electrically insulated from another portion of the first electrically conducting layer electrically coupled to the functional batteries, before deposition of the second electrically conducting layer.

9. The method according to claim 1, wherein the second electrically conducting layer is deposited so as to be electrically connected with all the batteries, said second electrically conducting layer being patterned to electrically insulate a portion of the second electrically conducting layer associated with a defective battery of another portion of the second electrically conducting layer common to the functional batteries.

10. The method according to claim 9, wherein the step of simultaneous forming the plurality of batteries on the first electrically conducting layer comprises deposition of an electrolytic membrane common to all the batteries, said electrolytic membrane electrically insulating the first and second electrically conducting layers between the batteries.

11. The method according to claim 1, wherein the second electrically conducting layer is deposited only on the functional batteries in order to form a battery device comprising the functional batteries electrically connected in parallel and the defective batteries electrically insulated from the functional batteries.

12. The method according to claim 1, comprising:
deposition of an electrically insulating layer to cover all the batteries of the plurality of batteries;
localized opening of the electrically insulating layer to access the functional batteries only; and
deposition of the second electrically conducting layer to connect all the functional batteries through the electrically insulating layer.

13. The method according to claim 1, wherein each battery of the plurality of batteries is tested individually.

14. The method according to claim 1, wherein the second group of defective batteries are tested individually.

15. The method according to claim 1, wherein the batteries of the plurality of batteries are spaced apart from each other in a direction parallel to the main surface of the support substrate.

16. The method according to claim 1, wherein all the batteries of the plurality of batteries are contained in a space delineated by the first electrically conducting layer and the second electrically conducting layer, the first and second electrically conducting layers defining parallel planes.

17. The method according to claim 1, wherein the first electrically conducting layer is continuous so as to electrically connect the plurality of batteries.

18. The method according to claim 1, wherein the second electrically conducting layer is deposited so as to connect directly and continuously the functional batteries.

19. The method according to claim 1, wherein forming the second electrically conducting layer is performed after the testing operation,
the first electrically conducting layer at least partly forming a first current collector of the battery device, and
the second electrically conducting layer at least partly forming a second current collector of the battery device.

* * * * *